(12) United States Patent
Guanziroli et al.

(10) Patent No.: US 9,237,406 B2
(45) Date of Patent: Jan. 12, 2016

(54) SPEAKER IMPEDANCE MEASUREMENT

(75) Inventors: Federico Guanziroli, Lentate sul Seveso (IT); Sergio Pernici, Bergamo (IT); Robert Nilsson, Lund (SE); Jan R. E. Thimansson, Broby (SE)

(73) Assignee: ST-ERICSSON SA, Plan-les-Ouates (CH)

( * ) Notice: Subject to any disclaimer, the term of this patent is extended or adjusted under 35 U.S.C. 154(b) by 481 days.

(21) Appl. No.: 13/809,066

(22) PCT Filed: Jul. 7, 2011

(86) PCT No.: PCT/EP2011/061519
§ 371 (c)(1),
(2), (4) Date: Mar. 25, 2013

(87) PCT Pub. No.: WO2012/004348
PCT Pub. Date: Jan. 12, 2012

(65) Prior Publication Data
US 2013/0170659 A1     Jul. 4, 2013

Related U.S. Application Data

(60) Provisional application No. 61/421,517, filed on Dec. 9, 2010.

(30) Foreign Application Priority Data

Jul. 9, 2010  (EP) ...................................... 10168989
Sep. 30, 2010  (EP) ...................................... 10183167

(51) Int. Cl.
| | |
|---|---|
| H04R 29/00 | (2006.01) |
| H03F 3/04 | (2006.01) |
| H03F 99/00 | (2009.01) |
| H04R 3/00 | (2006.01) |

(52) U.S. Cl.
CPC ................ *H04R 29/001* (2013.01); *H03F 3/04* (2013.01); *H03F 21/00* (2013.01); *H04R 3/00* (2013.01); *H04R 2420/05* (2013.01); *H04R 2499/11* (2013.01)

(58) Field of Classification Search
None
See application file for complete search history.

(56) References Cited

U.S. PATENT DOCUMENTS

| | | | |
|---|---|---|---|
| 6,870,934 B2 * | 3/2005 | Krochmal et al. | 381/59 |
| 8,325,931 B2 * | 12/2012 | Howard et al. | 381/58 |
| 2004/0086140 A1 * | 5/2004 | Fedigan et al. | 381/96 |
| 2007/0098190 A1 * | 5/2007 | Song et al. | 381/120 |
| 2007/0217625 A1 * | 9/2007 | Bai et al. | 381/96 |

FOREIGN PATENT DOCUMENTS

| | | |
|---|---|---|
| DE | 102007032281 A1 | 1/2009 |
| WO | 0018085 A1 | 3/2000 |

* cited by examiner

*Primary Examiner* — Curtis Kuntz
*Assistant Examiner* — Kenny Truong
(74) *Attorney, Agent, or Firm* — Coats & Bennett, PLLC

(57) ABSTRACT

An integrated circuit for processing audio and voice signals in a telephone is disclosed. The integrated circuit comprises an audio output port having a first and a second output terminal for connection to a first and a second input terminal, respectively, of a speaker. The integrated circuit further comprises an audio input port having a first and a second input terminal for connection to a first and a second output terminal of an audio input source. The integrated circuit also comprises at least one audio output path and one audio input path. Moreover, the integrated circuit comprises a test impedance, such as a resistor, (RT) for measuring an electrical impedance of the speaker.

15 Claims, 3 Drawing Sheets

SPEAKER IMPEDANCE MEASUREMENT

TECHNICAL FIELD

The present invention relates to measurement of an impedance of a speaker, such as a loud speaker or ear speaker.

BACKGROUND

Manufacturers of cellular telephones need to evaluate the quality of the loudspeaker and/or the ear speaker assembled inside a telephone. One way to test if the speaker is good is to carry out an evaluation of its acoustic response or the equivalent electrical impedance curve.

An example quality analysis test consists of looking at the amplitude variation of the resonance peaks. In fact, the frequency and amplitude of resonance peaks depend on the quality of speaker and are not disturbed by variations in speaker components. For calculation practical reasons, a method of looking at anti-resonance values may be used instead.

A circuit used to measure the impedance curve is illustrated in FIG. 1.

A resistor $R_1$ is connected in series to the measured speaker 5 and an external voltage generator 10 supplies, or forces, a voltage $V_{in}$. The resistance of $R_1$ may e.g. be selected as twice the DC resistance of the speaker.

Using a frequency sweep and measuring the voltage drop $V_1$ across the resistor $R_1$, it is possible to calculate the impedance $Z_{speaker}$ versus frequency f using the following formula:

$$Z_{speaker}(f) = R_1 \cdot \left(\frac{V_{in}}{V_1(f)} - 1\right) \quad \text{(Eq. 1)}$$

SUMMARY

An object of the present invention is to facilitate the evaluation of a speaker of an electronic device such as a telephone.

According to a first aspect, there is provided an integrated circuit for processing audio and voice signals in a telephone. The integrated circuit comprises an audio output port having a first and a second output terminal for connection to a first and a second input terminal, respectively, of a speaker. Furthermore, the integrated circuit comprises an audio input port having a first and a second input terminal for connection to a first and a second output terminal of an audio input source. Moreover, the integrated circuit comprises at least one audio output path having a digital input port and an analog output port with at least one analog output terminal. The integrated circuit also comprises an audio input path having an analog input port, comprising a first and a second input terminal, and a digital output port. In addition, the integrated circuit comprises a test impedance, such as a resistor, having a first and a second terminal. The first terminal of the test impedance is connected to a reference-voltage node of the integrated circuit.

The integrated circuit is configured such that, in a work mode of the integrated circuit, one of the at least one audio output paths is arranged to supply an audio output signal to the audio output port via the analog output port of that one of the at least one audio output path. Furthermore, the integrated circuit is configured such that, in the work mode of the integrated circuit, the audio input path is arranged to receive an audio input signal from the audio input port via the analog input port of the audio input path.

Moreover, the integrated circuit is configured such that, in a measurement mode of the integrated circuit, the at least one analog output terminal of the analog output port of one of the at least one audio output path is operatively connected to the first output terminal of the audio output port for supplying a test signal to the speaker. In addition, the integrated circuit is configured such that, in the measurement mode of the integrated circuit, the second terminal of the test impedance is operatively connected to the second output terminal of the audio output port. The integrated circuit is further configured such that, in the measurement mode of the integrated circuit, the first and second input terminal of the analog input port of the audio input path are operatively connected to the first and the second output terminal, respectively, of the audio output port for measuring an electrical impedance of the speaker.

As is further elaborated below, it should be noted that, in some embodiments, the one of the at least one audio output path, the at least one analog output terminal of the analog output port of which is operatively connected, in the measurement mode, to the first output terminal of the audio output port for supplying a test signal to the speaker may be the same audio output path that is arranged to supply an audio output signal to the audio output port in the work mode. In other embodiments, these audio output paths may be two different audio output paths.

The at least one audio output path may include a first audio output path having a digital input port and an analog output terminal and a second audio output path having a digital input port and an analog output port comprising a first and a second output terminal. The second audio output path may be said one of the at least one audio output path that is arranged, in the work mode, to supply said audio output signal to the audio output port via the analog output port of that one of the at least one audio output path. Furthermore, the first audio output path may be said one of the at least one audio output path, the at least one analog output terminal of the analog output port of which is operatively connected, in the measurement mode, to the first output terminal of the audio output port for supplying said test signal to the speaker.

The integrated circuit may comprise a first switch operatively connected between the second terminal of the test impedance and the second output terminal of the audio output port. The first switch may be arranged to be closed in the measurement mode and open in the work mode.

The integrated circuit may comprise a second switch operatively connected between the analog output terminal of the first audio output path and the first output terminal of the audio output port. The second switch may be arranged to be closed in the measurement mode and open in the work mode.

The integrated circuit may comprise a third switch operatively connected between the first input terminal of the analog input port of the audio input path and the first output terminal of the audio output port. The third switch may be arranged to be closed in the measurement mode and open in the work mode.

The integrated circuit may comprise a fourth switch operatively connected between the second input terminal of the analog input port of the audio input path and the second output terminal of the audio output port. The fourth switch may be arranged to be closed in the measurement mode and open in the work mode.

The first audio output path may comprise a digital-to-analog converter (DAC) operatively connected with an input port to the digital input port of the first audio path. The first audio output path may further comprise a driver amplifier operatively connected between an output port of the DAC and the analog output terminal of the first audio output path.

The audio input path may comprise an analog-to-digital converter (ADC) operatively connected with an output port to the digital output port of the audio input path. The audio input path may further comprise a preamplifier operatively connected between the analog input port of the audio input path and the ADC.

The second audio output path may comprise a driver amplifier having a first and a second output terminal directly connected to the first and the second output terminal, respectively, of the audio output port. The driver amplifier of the second audio output path may be arranged to be in high-impedive state in the measurement mode for limiting the influence on the impedance measurement.

The at least one audio output path may alternatively include a specific audio output path having a digital input port and an analog output port comprising a first and a second output terminal. The specific audio output path may be said one of the at least one audio output path that is arranged, in the work mode, to supply said audio output signal to the audio output port via the analog output port of that one of the at least one audio output path. In addition, the specific audio output path may also be said one of the at least one audio output path, the at least one analog output terminal of the analog output port of which is operatively connected, in the measurement mode, to the first output terminal of the audio output port for supplying said test signal to the speaker.

The specific audio output path may comprise a driver amplifier having a first and a second output terminal directly connected to the first and the second output terminal, respectively, of the audio output port. The second output terminal of the driver amplifier of the specific audio output path may be arranged to be in high-impedive state in the measurement mode for limiting the influence on the impedance measurement.

It should be noted that the word "specific", when used in the context of "the specific audio output path", is intended as a label to identify that audio output path (in the same way as "first" and "second" are intended as labels to identify "the first audio output path" and "the second audio output path"), but is not intended to imply any undisclosed functionality of that audio output path.

According to a second aspect, there is provided a method of measuring an electrical impedance of a speaker connected to the audio output port of the integrated circuit according to the first aspect. The method comprises:

a) setting the integrated circuit in the measurement mode;

b) applying a digital signal, such as a digital sinusoidal signal, of a given frequency to the digital input port of said one of the at least one audio output path, the at least one analog output terminal of the analog output port of which is operatively connected, in the measurement mode, to the first output terminal of the audio output port for supplying said test signal to the speaker; and c) determining a digital value representing said electrical impedance for said given frequency based an a digital output signal of the audio input path.

In some embodiments, the steps b) and c) may be repeated for each of a plurality of given frequencies.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Figure 1:
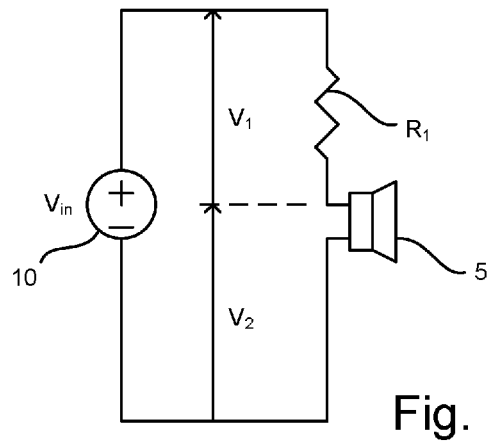
FIG. 1 illustrates an arrangement for impedance measurements of a speaker.

The inventors have realized that using the existing solution, illustrated with FIG. 1, the test needs an external signal generator with a precise output value $V_{in}$ and an accurate multimeter instrument (not shown in FIG. 1) to measure $V_1$. In mass production, this is relatively expensive both in term of equipment needed and time. Moreover, an external reference resistance ($R_1$) with a frequency independent value is needed, and a relatively large additional PCB area to mount $R_1$ and route the test signals.

According to embodiments of the present invention, the impedance measurement may be performed using components already included in audio/voice integrated circuits for a cellular phone (see e.g. FIG. 2 for a typical arrangement) without requiring additional external components. According to some embodiments, only some additional switches and an additional resistor are needed inside the integrated circuit.

According to some embodiments of the present invention, there is provided an integrated circuit for processing audio and voice signals in a telephone. The integrated circuit may comprise an audio output port having a first and a second output terminal for connection to a first and a second input terminal, respectively, of a speaker. Furthermore, the integrated circuit may comprise an audio input port having a first and a second input terminal for connection to a first and a second output terminal of a microphone or other analog signal source. Moreover, the integrated circuit may comprise a first audio output path having a digital input port and an analog output terminal. The integrated circuit may comprise a second audio output path having a digital input port and an analog output port comprising a first and a second output terminal. The integrated circuit may further comprise an audio input path having an analog input port, comprising a first and a second input terminal, and a digital output port. A resistor, or possibly any other type of impedance, having a first and a second terminal may be comprised in the integrated circuit. In the following, this component will be referred to as resistor, but it should be remembered that the resistor can be replaced with any other suitable type of impedance. The first terminal of the resistor may be connected to a reference-voltage node of the integrated circuit.

The integrated circuit may have a work mode and a measurement mode. The integrated circuit may be configured such that, in the work mode, the second audio output path is arranged to supply an audio output signal to the audio output port via the analog output port of the second audio output path. Furthermore, the integrated circuit may be configured such that, in the work mode, the audio input path is arranged to receive an audio input signal from the audio input port via the analog input port of the audio input path.

The integrated circuit may be configured such that, in the measurement mode, the analog output terminal of the first audio output path is operatively connected to the first output terminal of the audio output port for supplying a test signal to the speaker. Furthermore, the integrated circuit may be configured such that, in the measurement mode, the second terminal of the resistor is operatively connected to the second output terminal of the audio output port. Moreover, the integrated circuit may be configured such that, in the measurement mode, the first and second input terminal of the analog input port of the audio input path are operatively connected to the first and the second output terminal, respectively, of the audio output port for measuring an electrical impedance of the speaker.

The integrated circuit according to some embodiments of the invention may comprise a first switch operatively connected between the second terminal of the resistor and the second output terminal of the audio output port. The first switch may be arranged to be closed in the measurement mode and open in the work mode.

The integrated circuit may comprise a second switch operatively connected between the analog output terminal of the first audio output path and the first output terminal of the audio output port. The second switch may be arranged to be closed in the measurement mode and open in the work mode.

The integrated circuit may comprise a third switch operatively connected between the first input terminal of the analog input port of the audio input path and the first output terminal of the audio output port. The third switch may be arranged to be closed in the measurement mode and open in the work mode.

The integrated circuit may comprise a fourth switch operatively connected between the second input terminal of the analog input port of the audio input path and the second output terminal of the audio output port. The fourth switch may be arranged to be closed in the measurement mode and open in the work mode.

The first audio path may comprise a digital-to-analog converter (DAC) operatively connected with an input port of the DAC to the digital input port of the first audio output path and a driver amplifier operatively connected between an output port of the DAC and the analog output terminal of the first audio output path.

The audio input path may comprise an analog-to-digital converter (ADC), operatively connected with an output port of the ADC to the digital output port of the audio input path and a preamplifier operatively connected between the analog input port of the audio input path and an input port of the ADC.

The second audio output path may comprise a driver amplifier. The driver amplifier of the second audio output path may have a first and a second output terminal directly connected to the first and the second output terminal of the audio output port. The driver amplifier of the second audio output path may be arranged to be in a high-impedive state in the measurement mode for limiting the influence of the impedance measurement (the output impedance of said driver amplifier is connected in parallel with the speaker, and a too low value of said output impedance may have an adverse influence on the measurement). In the high-impedive state, the output impedance of the driver amplifier of the second audio output path may be higher than in the work mode (i.e. higher than in "normal operation"). According to some embodiments, the high-impedive state is attained by means of switching off output transistors of the driver amplifier of the second audio output path. According to some embodiments, the output impedance of the driver amplifier of the second audio output path is at least 100 times higher than the impedance of the speaker when the driver amplifier is in the high-impedive state. According to some embodiments, the output impedance of the driver amplifier of the second audio output path is at least 1 MΩ in the high-impedive state. For the embodiments where the first and second output terminals of the driver amplifier of the second audio output path are directly connected to the first and the second output terminal of the audio output port, the driver amplifier of the second audio output path may be used to drive speakers having a relatively low associated load impedance, as there are no switches in the signal paths between the output terminals of the driver amplifier of the second audio output path and the audio output port. According to some embodiments, said relatively low load impedence is in the range 1-100Ω. For example, the load impedance may be equal to or approximately equal to 32Ω (or lower). According to some embodiments, said relatively low load impedance is in the range 1-10Ω, such as but not limited to 4Ω, 6Ω, or 8Ω (or lower).

According to some embodiments of the present invention, there is provided a method of measuring an electrical impedance of a speaker connected to the audio output port of the above-mentioned integrated circuit. The method may comprise a) setting the integrated circuit in the measurement mode;

b) applying a digital sinusoidal signal of a given frequency to the digital input port of the first audio output path; and c) determining a digital value representing said electrical impedance for said given frequency based an a digital output signal of the audio input path.

Some embodiments may comprise repeating steps b) and c) for a plurality of given frequencies.

Figure 2:
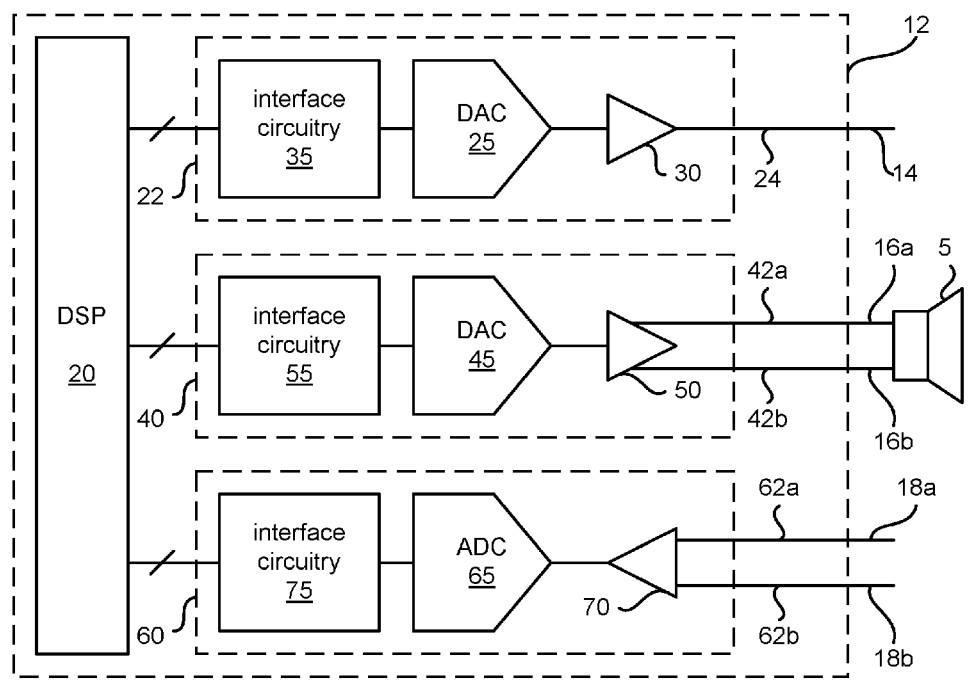
FIG. 2 illustrates an audio/voice system for a cellular phone.

FIG. 2 illustrates a reference example of an audio/voice integrated circuit 12, which is used below for comparison with embodiments of the present invention. The integrated circuit 12 has an audio output terminal 14, which may e.g. be a so called line out terminal. Furthermore, an audio output port having a first and a second output terminal 16a,16b for connection to a first and a second input terminal, respectively, of a speaker 5, which is also shown together with the integrated circuit 12. Moreover, the integrated circuit 12 comprises an audio input port having a first and a second input terminal (18a,18b) for connection to a first and a second output terminal of an audio input source, such as a microphone, which may e.g. be a built-in microphone of a telephone.

In the example illustrated in FIG. 2, the integrated circuit 12 comprises a digital signal processor (DSP) 20 for processing digital audio signals.

Furthermore, in the example illustrated in FIG. 2, the integrated circuit 12 comprises an audio output path 22, in the following referred to as the "RX 1 path 22". The RX 1 path 22 has an analog output terminal 24 operatively (possibly directly) connected to the audio output terminal 14 of the integrated circuit 12. The RX 1 path 22 may comprise a DAC 25 operatively connected with an input port to a digital input port of the RX 1 path 22. Said digital input port may be connected to the DSP 20 for receiving digital audio signals from the DSP 20. The RX 1 path 22 may further comprise a driver amplifier 30, in the following referred to as "the DRIVER A 30", operatively connected between an output port of the DAC 25 and the analog output terminal 24 of the RX 1 path 22. As is illustrated in FIG. 2, the RX 1 path may comprise interface circuitry 35 operatively connected between the DAC 25 and the digital input port of the RX 1 path 22. The interface circuitry 35 may e.g. comprise digital interpolation filters.

In the example illustrated in FIG. 2, the integrated circuit comprises another audio output path 40, in the following referred to as "the RX 2 path 40". The RX 2 path 40 has a digital input port. Furthermore, the RX 2 path 40 has an analog output port comprising a first and a second output terminal 42a, 42b. As illustrated in FIG. 2, said digital input port may be connected to the DSP 20 for receiving digital audio signals from the DSP 20. As illustrated in FIG. 2, the RX 2 path 40 may comprise a driver amplifier 50 having a first and a second output terminal. Said first and second output terminal of the driver amplifier 50 may be directly connected to the first and second output terminal 42a and 42b, respectively, of the RX 2 path 40. Furthermore, as illustrated in FIG. 2, the first and second output terminals 42a and 42b may be directly connected to the output terminals 16a and 16b, respectively, of the integrated circuit 12. The RX 2 path 40 may comprise a DAC 45 operatively connected with an input port to the digital input port of the RX 2 path 40. The driver amplifier 50 may be operatively connected between an output port of the DAC 45 and the analog output port of the RX 2 path 40. Similarly to the RX 1 path 22, the RX 1 path may comprise interface circuitry 55 operatively connected between the DAC 45 and the digital input port of the RX 2 path 40. Similarly to interface circuitry 35 of the RX 1 path 22, the interface circuitry 55 may e.g. comprise digital interpolation filters.

In the reference example illustrated in FIG. 2, the integrated circuit 12 further comprises an audio input path 60, in the following referred to as "the TX 1 path 60". The TX 1 path 60 has an analog input port comprising input terminals 62a and 62b for receiving analog audio signals. As illustrated in FIG. 2, the TX 1 path 60 may comprise an ADC 65 for converting received analog audio signals to a digital representation. The ADC 65 may be operatively connected with an output port to a digital output port of the TX 1 path 60. Said digital output port may be connected to the DSP 20 for forwarding digital audio signals to the DSP 20. Furthermore, as illustrated in FIG. 2, the TX 1 path 60 may comprise a preamplifier 70 operatively connected between the analog input port the TX 1 path 60 and the ADC 65. As is illustrated in FIG. 2, the TX 1 path may comprise interface circuitry 75 operatively connected between the ADC 65 and the digital output port of the TX 1 path 60. The interface circuitry 75 may e.g. comprise digital interpolation filters.

Figure 3:
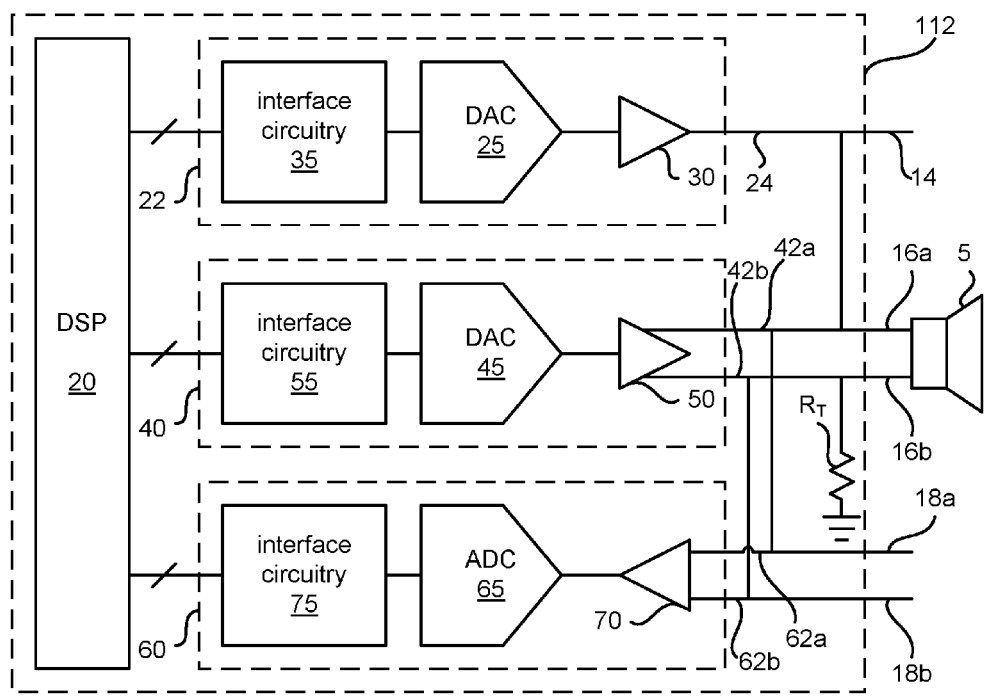
FIGS. 3-4 illustrate embodiments of the present invention.
Figure 4:
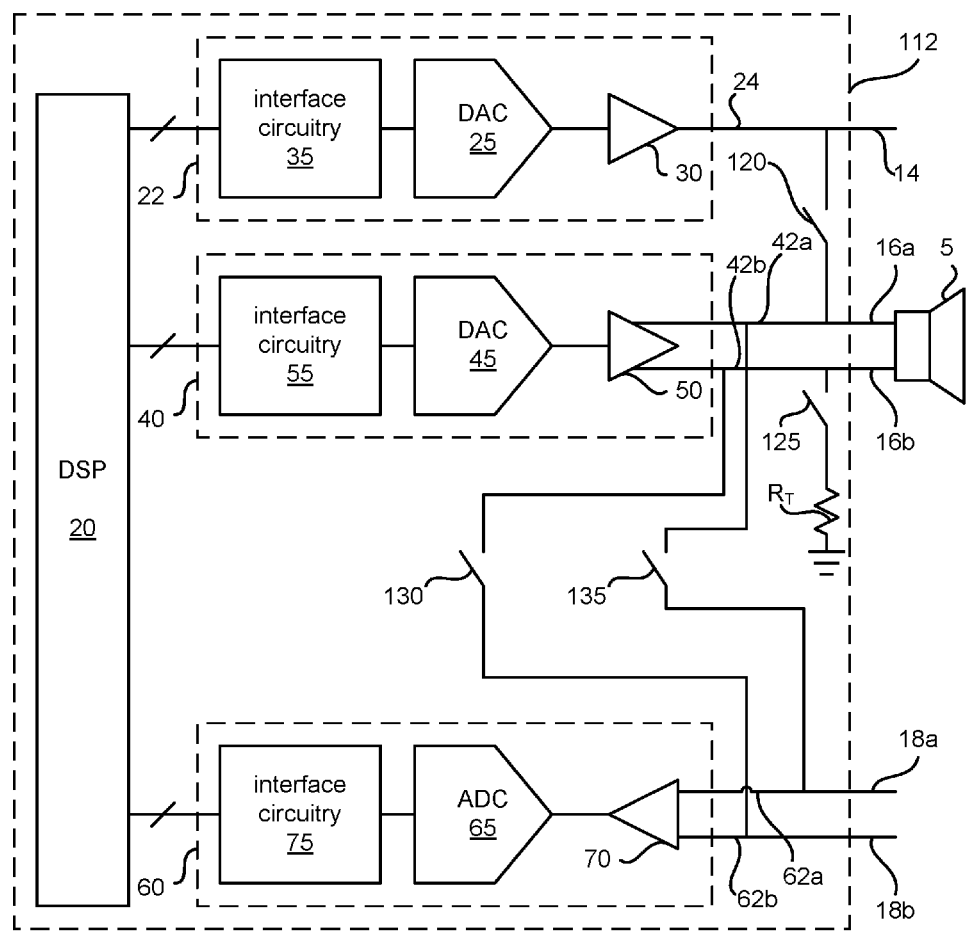

An example embodiment of the present invention is illustrated in FIG. 3 and FIG. 4. Elements that are the same as in the reference example in FIG. 2 are denoted with the same reference signs in FIGS. 3 and 4 as in FIG. 2, and are not further described in great detail.

FIG. 3 illustrates an audio/voice integrated circuit 112 during impedance measurement according to some embodiments of the invention. A digital test machine (for example the DSP 20) forces a digital signal, such as a digital sinusoidal signal, with a fixed frequency at the digital input port of the RX 1 path 22. This is converted to an analog signal by the RX 1 path 22, by means of the DAC 25 and applied, through an output driver (i.e. DRIVER A 30), to the external speaker transducer 5.

With reference to FIG. 4, the impedance testing procedure (or "measurement mode") is activated by closing a switch 120 (corresponding to the above-mentioned second switch) which connects the single-ended output of DRIVER A 30 to one pin of the speaker 5 and closing a switch 125 (corresponding to the above-mentioned first switch), connecting the other pin of the speaker to the resistor $R_T$. The value of $R_T$ may be comparable (the same or similar) to the minimum load supported by the forcing driver DRIVER A 30 (normally this value is larger than the measured speaker load). As above, it should be remembered that the resistor $R_T$ in some embodiments may be replaced with any other suitable type of impedance.

The output pads of the speaker driver are then routed through the switches 130 and 135 (corresponding to the above-mentioned third and fourth switches), to the differential input of the preamplifier 70 to send the voltage drop to the TX 1 path 60. The TX 1 path 60 converts this analog signal to a digital signal, by means of the ADC 65. The digital signal can be processed by the test digital machine (e.g. DSP 20).

The digital test machine can analyze the digital signal to calculate $V_2$ and the speaker impedance at the forced sinusoidal frequency value using e.g. the above formula of Eq. 1.

The digital test machine algorithm can act to compensate the typical parameter variation of the integrated components (e.g. generator errors, switches impedances, parasitic resistors, resistor variations, etc).

For instance, to avoid a measurement error due to $R_T$ variation or variations in switches impedances, the digital machine may first perform an impedance measurement at low frequency (for instance 100 Hz) and normalize all the following measurements (e.g. at higher frequencies) to the ratio between the typical low frequency impedance value and the measured low frequency impedance value.

According to another example, an algorithm may be used to prevent an offset error from affecting the measurement accuracy. The digital test machine can, at the beginning of the test procedure, evaluate the offset and then subtract it from every measured value.

A normal audio system can typically guarantee the needed resolution in frequency and in amplitude on sinusoidal signal generated and can normally guarantee correct/accurate measurement of the voltage drop $V_2$ using the high gain capability of the preamplifier 70, its low input noise, and the resolution of a normal TX channel.

The gain capability of the preamplifier 70 and its low input noise may be of importance, because in some conditions, $V_2$ could be a relatively weak signal. In fact, the forcing DRIVER A 30 can normally drive a relatively high load resistance ($R_T$ of some kΩ), whereas the loudspeaker resistance could be much lower (e.g. down to 6Ω). In this case the voltage drop $V_2$ is relatively low in amplitude, but thanks to the relatively high gain of the preamplifier 70, the signal amplitude on the TX 1 path 60 is good enough for an adequate measurement. The aforementioned high gain and low noise properties are automatically attained in embodiments where the TX1 path 70 (or "audio input path") is a microphone input path. In embodiments where the TX1 path is a so called "line in" path, an additional dedicated preamplifier may have to be provided for impedance measurements. However, this should be decided from case to case, e.g. based on measurements on prototypes and/or based on computer simulations.

By means of embodiments of the present invention, a loudspeaker or ear speaker impedance measurement can be performed using only blocks already present inside an audio/voice integrated circuit for cellular phones, such as the reference example of the integrated circuit 12 illustrated in FIG. 2. These blocks in "normal mode" (or work mode) are used to manage the audio/voice signals. However, in "test mode" (or measurement mode), they can be arranged to perform the speaker impedance measurement. In some embodiments, the additional on-chip hardware required to enable the impedance measurement amounts to a few switches (e.g. switches 120, 125, 130, 135) and a reference resistor (e.g. $R_T$), which is a relatively low hardware overhead cost.

In this way, the equipment needed for testing is reduced to a DSP. It should be noted that the DSP 20 already present for audio signal processing on the integrated circuit 12 (see e.g. FIG. 2) can be used for this purpose as the above-mentioned "digital test machine". Hence, said DSP 20 may be arranged or programmed for generating test signals and impedance measurements in the measurement mode, which is advantageous from a hardware-cost point of view, e.g. since no additional dedicated digital test machine or DSP is required for the impedance measurements. Furthermore, the assembly cost is reduced, e.g. since no external components and no additional space on the PCB board are required to enable the impedance measurement.

The present invention has been described above with reference to specific embodiments. However, other embodiments than the above described are possible within the scope of the invention. For example, in the embodiments described above, the RX 1 path 22 (or "first audio output path 22") has been used to supply the test signal to the speaker 5 in the measurement mode. However, according to alternative embodiments, the RX 2 path 40 may be the audio output path that supplies the test signal to the speaker 5 in the measurement mode. This can e.g. be accomplished if the driver amplifier 50 is configurable such that at least the output terminal of the driver amplifier 50 that is connected to the output terminal 42b of the RX 2 path 40 can be individually set in a high-impedive state (various alternative definitions of "high-impedive state" have already been presented above in another context and are applicable in this context as well). In the measurement mode, this output terminal of the driver amplifier 50 can thereby be effectively disconnected from the speaker 5 (without the need for any switch in the signal path between the driver amplifier 50 and the speaker 5), and the other output terminal of the driver amplifier 50 can then be used to apply the test signal. In such an embodiment, there is no need for the RX 1 path 22 from an impedance-measurement perspective (although it may be needed for other reasons, e.g. to drive a line-out output).

Thus, more generally, in accordance with some embodiments of the present invention, the integrated circuit 112 for processing audio and voice signals in a telephone comprises at least one audio output path (such as the RX 1 path 22 and/or the RX 2 path 40) having a digital input port and an analog output port with at least one analog output terminal (such as the analog output terminal 24 and/or the analog output terminal 42a). In the work mode, one of the at least one audio output path is arranged to supply an audio output signal to the audio output port via the analog output port of that one of the at least one audio output path. In the measurement mode, the at least one analog output terminal of the analog output port of one of the at least one audio output path is operatively connected to the first output terminal of the audio output port for supplying a test signal to the speaker. In some embodiments, such as those described with reference to FIGS. 3-4, said one of the at least one audio output path that is arranged, in the work mode, to supply said audio output signal to the audio output port via the analog output port of that one of the at least one audio output path is the RX 2 path 40, whereas said one of the at least one audio output path, the at least one analog output terminal of the analog output port of which is operatively connected, in the measurement mode, to the first output terminal of the audio output port for supplying said test signal to the speaker is the RX 1 path 22. According to other embodiments, such as the above-mentioned alternative embodiments, a specific one (e.g. the RX 2 path 40) of the at least one audio output path is both said one of the at least one audio output path that is arranged, in the work mode, to supply said audio output signal to the audio output port via its analog output port and said one of the at least one audio output path, the at least one analog output terminal of the analog output port of which is operatively connected, in the measurement mode, to the first output terminal 16a of the audio output port for supplying said test signal to the speaker 5.

The different features of the embodiments may be combined in other combinations than those described. The scope of the invention is only limited by the appended patent claims.

It should be emphasized that the term "comprises/comprising" when used in this specification is taken to specify the presence of stated features, integers, steps, or components, but does not preclude the presence or addition of one or more other features, integers, steps, components, or groups thereof.

The invention claimed is:

1. An integrated circuit for processing audio and voice signals in a telephone, comprising:
   an audio output port having a first and a second audio output terminal for connection to a first and a second speaker input terminal, respectively, of a speaker;
   an audio input port having a first and a second audio input terminal for connection to a first and a second source output terminal of an audio input source;
   at least one audio output path having a digital input port and an analog output port with at least one analog output terminal;
   an audio input path having an analog input port and a digital output port, the analog input port comprising a first and a second analog input terminal; and
   a test impedance having a first and a second impedance terminal, wherein the first impedance terminal is connected to a reference-voltage node of the integrated circuit;
   wherein the integrated circuit is configured such that:
      in a work mode of the integrated circuit;
         one of the at least one audio output paths is arranged to supply an audio output signal to the audio output port via the analog output port of that one of the at least one audio output path; and
         the audio input path is arranged to receive an audio input signal from the audio input port via the analog input port of the audio input path; and
      in a measurement mode of the integrated circuit;
         the at least one analog output terminal of the analog output port of one of the at least one audio output path is operatively connected to the first audio output terminal of the audio output port for supplying a test signal to the speaker;
         the second impedance terminal of the test impedance is operatively connected to the second audio output terminal of the audio output port; and
         the first and second analog input terminal of the analog input port of the audio input path are operatively connected to the first and the second audio output terminal, respectively, of the audio output port for measuring an electrical impedance of the speaker.

2. The integrated circuit according to claim 1, wherein the at least one audio output path includes:
   a first audio output path having a first digital input port and a first analog output terminal; and
   a second audio output path having a second digital input port and an analog output port comprising a second and a third analog output terminal.

3. The integrated circuit according to claim 2, wherein the second audio output path is said one of the at least one audio output path that is arranged, in the work mode, to supply said audio output signal to the audio output port via the analog output port of that one of the at least one audio output path.

4. The integrated circuit according to claim 2, wherein the first analog output terminal of the first audio output path is operatively connected, in the measurement mode, to the first audio output terminal of the audio output port for supplying said test signal to the speaker.

5. The integrated circuit according to claim 2, comprising a first switch operatively connected between the second impedance terminal of the test impedance and the second audio output terminal of the audio output port, wherein the first switch is arranged to be closed in the measurement mode and open in the work mode.

6. The integrated circuit according to claim 2, comprising a second switch operatively connected between the first analog output terminal of the first audio output path and the first audio output terminal of the audio output port, wherein the second switch is arranged to be closed in the measurement mode and open in the work mode.

7. The integrated circuit according to claim 2, comprising a third switch operatively connected between the first analog input terminal of the analog input port of the audio input path and the first audio output terminal of the audio output port, wherein the third switch is arranged to be closed in the measurement mode and open in the work mode.

8. The integrated circuit according to claim 2, comprising a fourth switch operatively connected between the second analog input terminal of the analog input port of the audio input path and the second audio output terminal of the audio output port, wherein the fourth switch is arranged to be closed in the measurement mode and open in the work mode.

9. The integrated circuit according to claim 2, wherein the second audio output path comprises a driver amplifier having a first and a second amplifier output terminal directly connected to the first and the second audio output terminal, respectively, of the audio output port.

10. The integrated circuit according to claim 9, wherein the driver amplifier of the second audio output path is arranged to be in high-impeditive state in the measurement mode for limiting the influence on the impedance measurement.

11. The integrated circuit according to claim 1, wherein:
the at least one audio output path includes a specific audio output path having a first digital input port, and wherein the at least one analog output terminal of the analog output port comprises a first and a second analog output terminal;
the specific audio output path is said one of the at least one audio output path that is arranged, in the work mode, to supply said audio output signal to the audio output port via the analog output port of that one of the at least one audio output path; and
the specific audio output path is also said one of the at least one audio output path, wherein a first analog output terminal of a different audio output path is operatively connected, in the measurement mode, to the first audio output terminal of the audio output port for supplying said test signal to the speaker.

12. The integrated circuit according to claim 11, wherein the specific audio output path comprises a driver amplifier having a first and a second amplifier output terminal directly connected to the first and the second audio output terminal, respectively, of the audio output port.

13. The integrated circuit according to claim 12, wherein the second amplifier output terminal of the driver amplifier of the specific audio output path is arranged to be in high-impeditive state in the measurement mode for limiting the influence on the impedance measurement.

14. A method of measuring an electrical impedance of a speaker connected to an audio output port of an integrated circuit for processing audio and voice signals in a telephone, the audio output port comprising a first and a second audio output terminal for connection to a first and a second speaker input terminal, respectively, of the speaker, the method comprising:
a) setting the integrated circuit in a measurement mode, the integrated circuit comprising:
an audio input port having a first and a second audio input terminal for connection to a first and a second source output terminal of an audio input source;
at least one audio output path having a digital input port and an analog output port with at least one analog output terminal;
an audio input path having an analog input port and a digital output port, the analog input port comprising a first and a second analog input terminal; and
a test impedance having a first and a second impedance terminal, wherein the first impedance terminal is connected to a reference-voltage node of the integrated circuit;
where in the measurement mode, the integrated circuit is configured such that:
the at least one analog output terminal of the analog output port of one of the at least one audio output path is operatively connected to the first audio output terminal of the audio output port for supplying a test signal to the speaker;
the second impedance terminal of the test impedance is operatively connected to the second audio output terminal of the audio output port; and
the first and second analog input terminal of the analog input port of the audio input path are operatively connected to the first and the second audio output terminal, respectively, of the audio output port for measuring an electrical impedance of the speaker;
b) applying a digital signal of a given frequency to the digital input port of one of the at least one audio output path, the at least one analog output terminal of the analog output port of which is operatively connected, in the measurement mode, to the first audio output terminal of the audio output port for supplying said test signal to the speaker; and
c) determining a digital value representing said electrical impedance for said given frequency based on a digital output signal of the audio input path.

15. The method according to claim 14, comprising repeating steps b) and c) for each of a plurality of given frequencies.

* * * * *